(12) United States Patent
Gotou et al.

(10) Patent No.: US 7,310,019 B2
(45) Date of Patent: Dec. 18, 2007

(54) HIGH FREQUENCY POWER AMPLIFIER

(75) Inventors: Seiki Gotou, Tokyo (JP); Akira Inoue, Tokyo (JP); Akira Ohta, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 107 days.

(21) Appl. No.: 11/398,627

(22) Filed: Apr. 6, 2006

(65) Prior Publication Data
US 2007/0024371 A1 Feb. 1, 2007

(30) Foreign Application Priority Data

Jul. 29, 2005 (JP) ............................ 2005-220933
Dec. 21, 2005 (JP) ............................ 2005-367964

(51) Int. Cl.
*H03F 3/68* (2006.01)

(52) U.S. Cl. .................... 330/295; 330/302; 330/286

(58) Field of Classification Search ............... 330/295, 330/302, 286
See application file for complete search history.

(56) References Cited

U.S. PATENT DOCUMENTS

| | | | |
|---|---|---|---|
| 5,105,167 A * | 4/1992 | Peczalski .................... 330/295 |
| 5,592,122 A | 1/1997 | Masahiro et al. |
| 6,060,951 A * | 5/2000 | Inoue ......................... 330/307 |
| 6,177,841 B1 * | 1/2001 | Ohta et al. .................. 330/302 |
| 6,236,274 B1 * | 5/2001 | Liu ............................. 330/302 |
| 6,344,775 B1 * | 2/2002 | Morizuka et al. ............ 330/288 |
| 6,838,941 B2 * | 1/2005 | Yamamoto et al. ......... 330/295 |

FOREIGN PATENT DOCUMENTS

JP 08-037433 2/1996

* cited by examiner

*Primary Examiner*—Patricia Nguyen
(74) *Attorney, Agent, or Firm*—Leydig, Voit & Mayer, Ltd.

(57) ABSTRACT

A high frequency power amplifier includes: a multi-finger transistor including transistor cells electrically connected in parallel; an input side matching circuit connected to gate electrodes of the transistor cells; and resonant circuits, each resonant circuit being connected between a gate electrode of a respective one of the transistor cells and the input side matching circuit. The resonant circuits resonate at a second harmonic of the operational frequency of the transistor or at a frequency within a predetermined range centered at the second harmonic and act as a short circuit or exhibit low impedance as seen from the gate electrode.

19 Claims, 9 Drawing Sheets

HIGH FREQUENCY POWER AMPLIFIER

BACKGROUND OF THE INVENTION

1. Field of the Invention

The present invention relates to a high frequency power amplifier for use in communications devices operating in the microwave or millimeter wave band for mobile communications, satellite communications, etc.

2. Background Art

In microwave communications systems using a multicarrier signal or a signal modulated using a recent CDMA technique, etc., there is a need to minimize the influence of distortions due to the nonlinearity of the high frequency power amplifiers. On the other hand, one known method for operating a high frequency power amplifier with high efficiency is to set the load conditions on the input side such that the second harmonic is substantially short-circuited (see, e.g., Japanese Patent No. 2695395).

Incidentally, in order to deliver high power, high-power power amplifiers for mobile or satellite communications employ multi-finger transistors in which a plurality of transistor cells are electrically connected in parallel to increase the gate width.

FIG. 13 shows such a conventional high frequency power amplifier. Referring to the figure, a plurality of transistor cells 1 are electrically connected in parallel to one another. An input side matching circuit 2 is connected to their gate electrodes, and an output side matching circuit 3 is connected to their drain electrodes. Further, a resonant circuit 4 is connected to the gate electrodes in order to control harmonic loads. The resonant circuit 4 resonates at the second harmonic frequency of the operational frequency of the transistor.

Since the multi-finger transistor inherently has low input/output impedance, the loads on the matching circuits, which are connected to the transistor to achieve impedance matching at the operational frequency, are very small. To short-circuit the second harmonic, the impedance load at the second harmonic must be even lower than the very low impedance load at the fundamental.

However, conventional high frequency power amplifiers cannot achieve such a low impedance load and hence fail to deliver improved distortion characteristics, since the resonant circuit is connected to the gate electrode combining circuit on the input side instead of being connected to each gate electrode.

SUMMARY OF THE INVENTION

The present invention has been devised to solve the above problems. It is, therefore, an object of the present invention to provide a high frequency power amplifier employing a multi-finger transistor and adapted to have improved distortion characteristics.

According to one aspect of the present invention, a high frequency power amplifier includes: a multi-finger transistor including a plurality of transistor cells electrically connected in parallel; an input side matching circuit connected to gate electrodes of the plurality of transistor cells; and resonant circuits, each connected between a gate electrode of a respective one of the plurality of transistor cells and the input side matching circuit; wherein the resonant circuits resonate at a second harmonic frequency of the operational frequency of the transistor or at a frequency within a predetermined range centered at the second harmonic frequency so as to act as a short circuit or exhibit sufficiently low impedance as seen from the gate electrode side.

The present invention allows a high frequency power amplifier employing a multi-finger transistor to have improved distortion characteristics.

Other and further objects, features and advantages of the invention will appear more fully from the following description.

DETAILED DESCRIPTION OF THE PREFERRED EMBODIMENTS

First Embodiment

Figure 1:
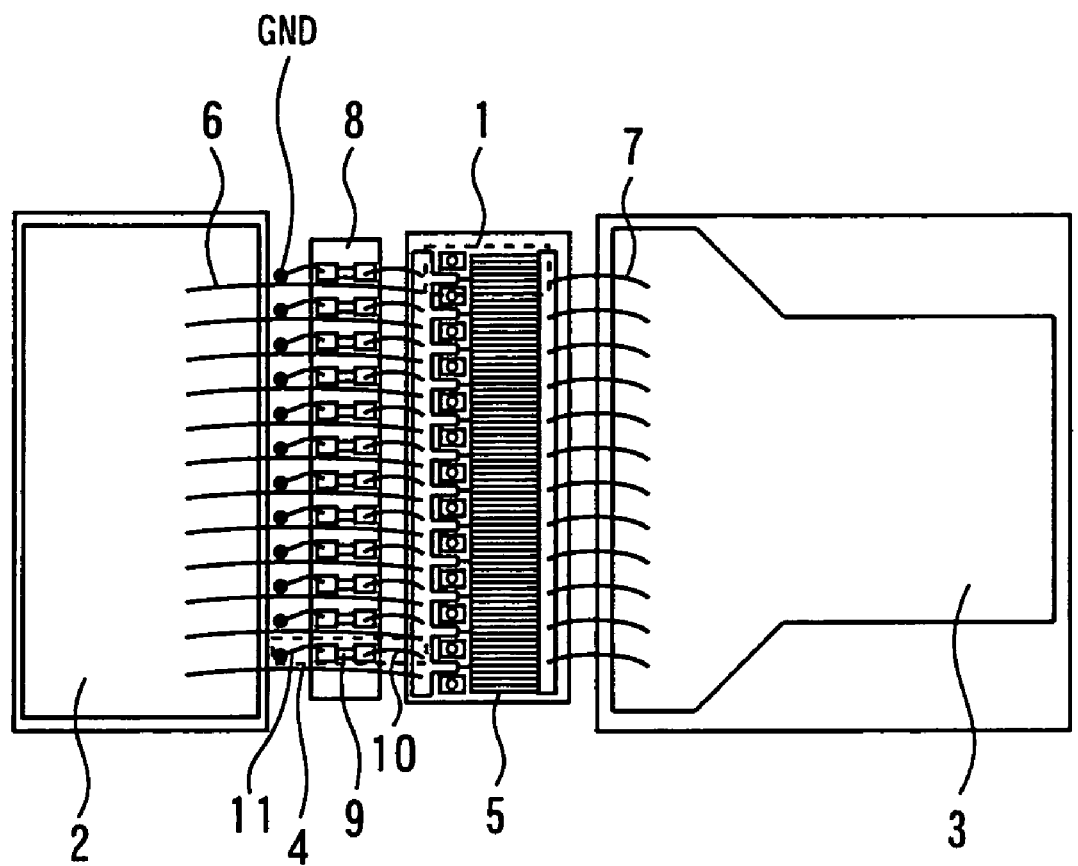
FIG. 1 is a top view of a high frequency power amplifier according to a first embodiment of the present invention.
Figure 2:
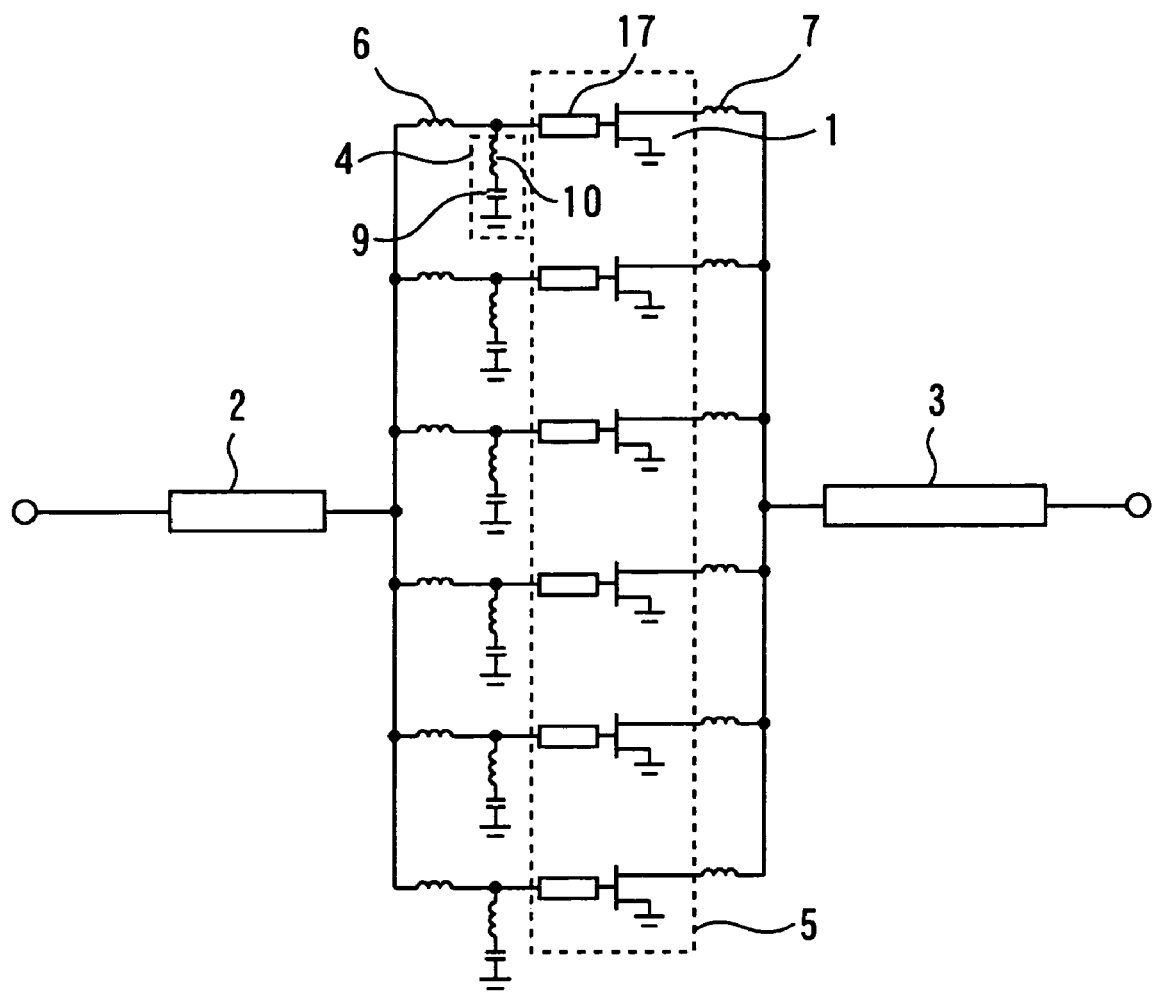
FIG. 2 is a circuit diagram of the high frequency power amplifier of FIG. 1.

FIG. 1 is a top view of a high frequency power amplifier according to a first embodiment of the present invention; and FIG. 2 is a circuit diagram of the high frequency power amplifier of FIG. 1.

Referring to FIGS. 1 and 2, a plurality of transistor cells 1 are electrically connected in parallel to form a multi-finger transistor 5. The gate electrodes of the transistor cells 1 are connected to an input side matching circuit 2 by bonding wires 6. The drain electrodes of the transistor cells 1, on the other hand, are connected to an output side matching circuit 3 by bonding wires 7. Further, the source electrodes of the transistor cells 1 are grounded. The bonding wires 6 and 7 act as inductors.

According to the present invention, resonant circuits 4 are provided between the input side matching circuit 2 and the gate electrodes of the transistor cells 1. More specifically, the gate electrode of each transistor cell 1 is connected to one end of a respective resonant circuit 4 by a respective transmission line 17, and is connected to one end of a respective bonding wire 6, which is connected at the other end to the input side matching circuit 2.

Each resonant circuit 4 includes an MIM capacitor 9 formed on a different chip 8 than the transistor 5. One end of the MIM capacitor 9 is connected to the gate electrode of a corresponding transistor cell 1 through a bonding wire 10, while the other end is connected to a ground plane through a bonding wire 11 and thereby grounded. Each bonding wire 10 acts as an inductor. Thus, the MIM capacitors 9, which are passive devices and hence have a high process yield, are formed on a different chip 8 than the transistor 5, which is an active device. This allows productivity to be increased.

With this arrangement, the resonant circuits 4 are set to resonate at the second harmonic frequency of the operational frequency of the transistor 5 or at a frequency within a predetermined range centered at the second harmonic frequency so as to act as a short circuit or exhibit sufficiently low impedance (at the second harmonic frequency) as seen from the gate electrode side. Thus, the load impedance at the second harmonic as seen from the gate side of the transistor cells 1 can be reduced, as compared to conventional arrangements.

Figure 3:
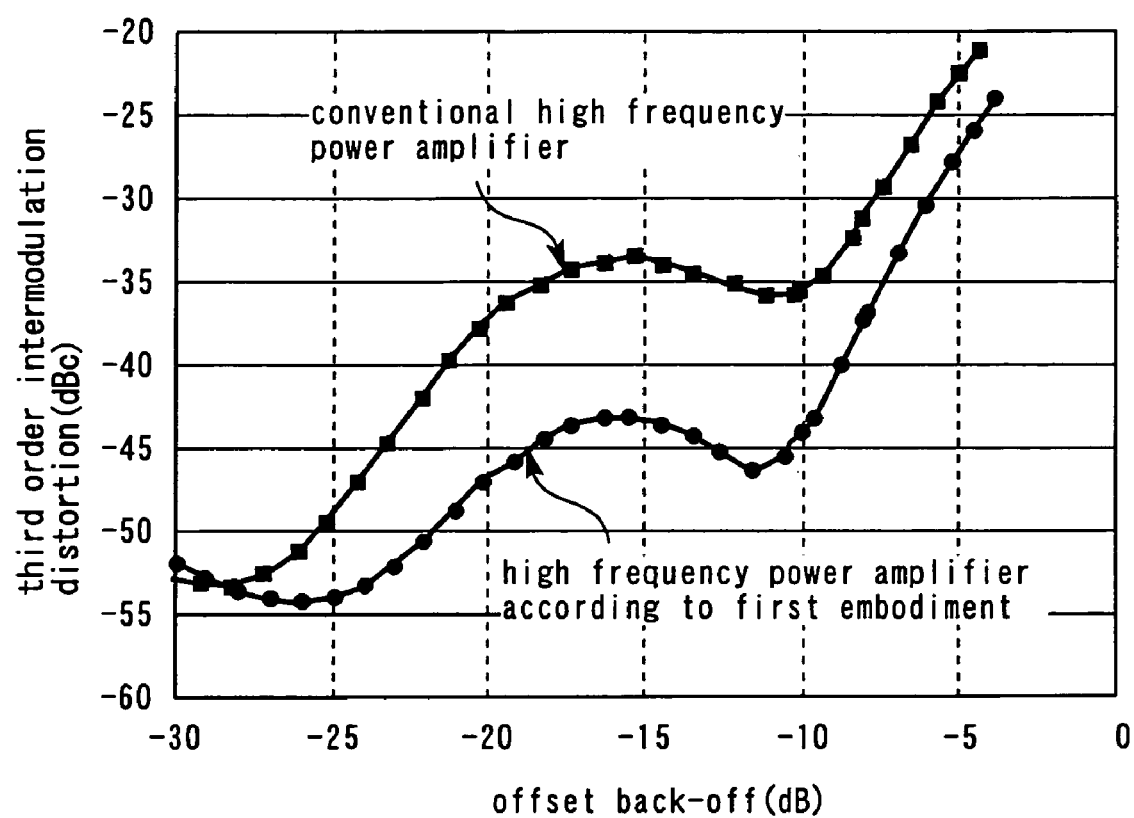
FIG. 3 shows the distortion characteristics of both a conventional high frequency power amplifier and the high frequency power amplifier of the present embodiment.

FIG. 3 shows the distortion characteristics of both a conventional high frequency power amplifier and the high frequency power amplifier of the present embodiment. The horizontal axis represents the amount of "offset back-off" with respect to the saturation power of the amplifiers, while the vertical axis represents the third order intermodulation distortion (two input signals). As can be seen from the figure, the high frequency power amplifier of the present embodiment has considerably improved distortion characteristics.

Second Embodiment

Figure 4:
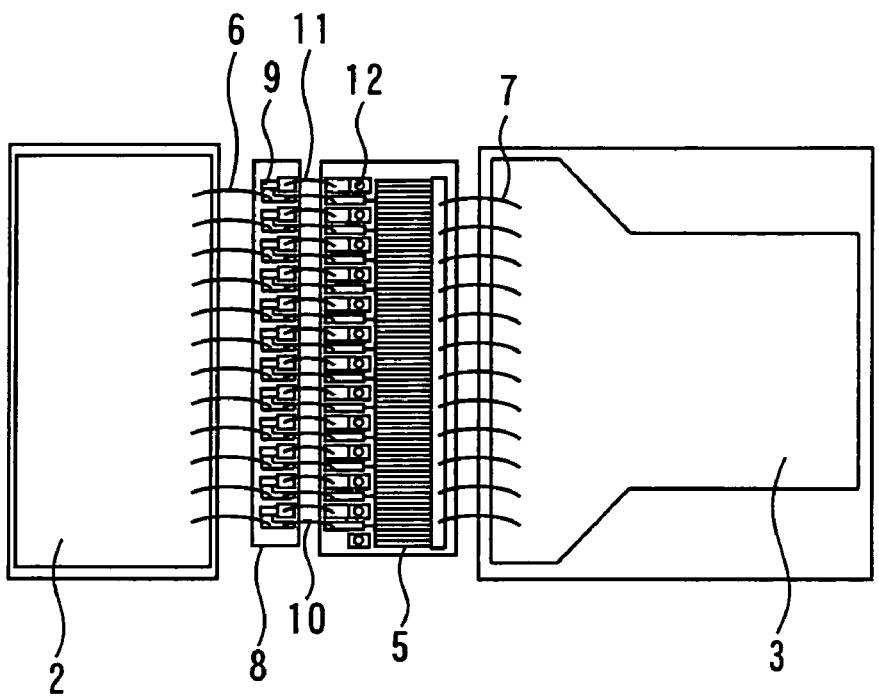
FIG. 4 is a top view of a high frequency power amplifier according to a second embodiment of the present invention.

FIG. 4 is a top view of a high frequency power amplifier according to a second embodiment of the present invention. According to the present embodiment, the other end of each MIM capacitor 9 is connected by a bonding wire 11 to a throughhole 12 formed on the same chip as the transistor 5 and is grounded through the throughhole 12. All other components are similar to those described in connection with the first embodiment. This arrangement prevents the change in the characteristics due to variation of the bonding wires, etc.

Third Embodiment

Figure 5:
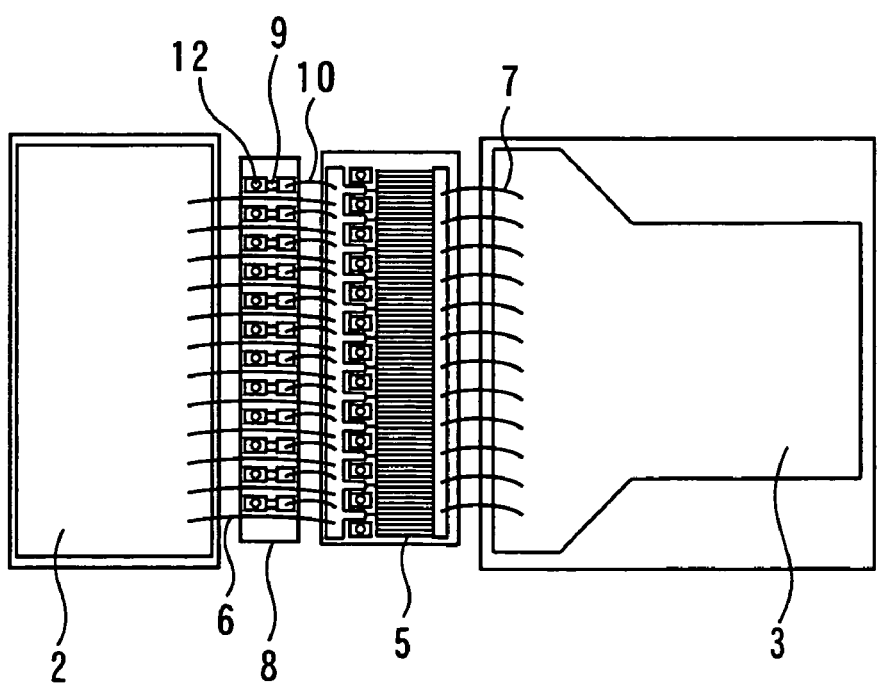
FIG. 5 is a top view of a high frequency power amplifier according to a third embodiment of the present invention.

FIG. 5 is a top view of a high frequency power amplifier according to a third embodiment of the present invention. According to the present embodiment, the other end of each MIM capacitor 9 is grounded through a throughhole 12 formed on a different chip (8) than the transistor 5. All other components are similar to those described in connection with the first and second embodiments. This arrangement allows the bonding wires 11 to be eliminated, thereby preventing variations in the inductance.

Fourth Embodiment

Figure 6:
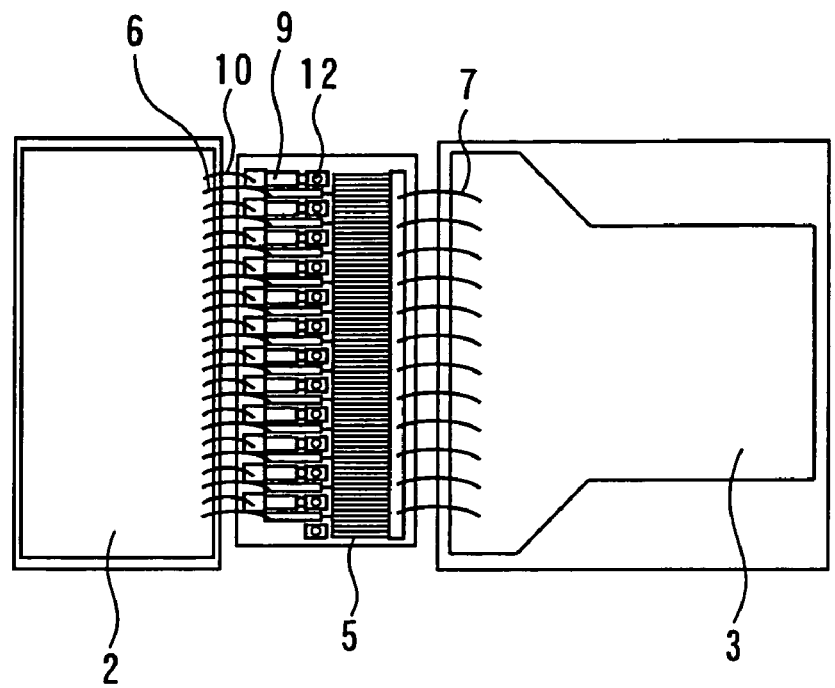
FIG. 6 is a top view of a high frequency power amplifier according to a fourth embodiment of the present invention.

FIG. 6 is a top view of a high frequency power amplifier according to a fourth embodiment of the present invention. According to the present embodiment, each resonant circuit includes an MIM capacitor 9 formed on the same chip as the transistor 5. One end of the MIM capacitor 9 is connected by a bonding wire 10 to the input side matching circuit 2, which in turn is connected to the gate electrodes of the transistor cells 1 by bonding wires 6. That is, one end of each MIM capacitor 9 is connected to the gate electrode of a respective transistor cell 1, and the other end is grounded through a throughhole 12 formed on the same chip as the transistor 5. All other components are similar to those described in connection with the first to third embodiments. This arrangement (that is, the MIM capacitors 9 being formed on the same chip as the transistor 5) allows the assembly process to be simplified.

Fifth Embodiment

Figure 7:
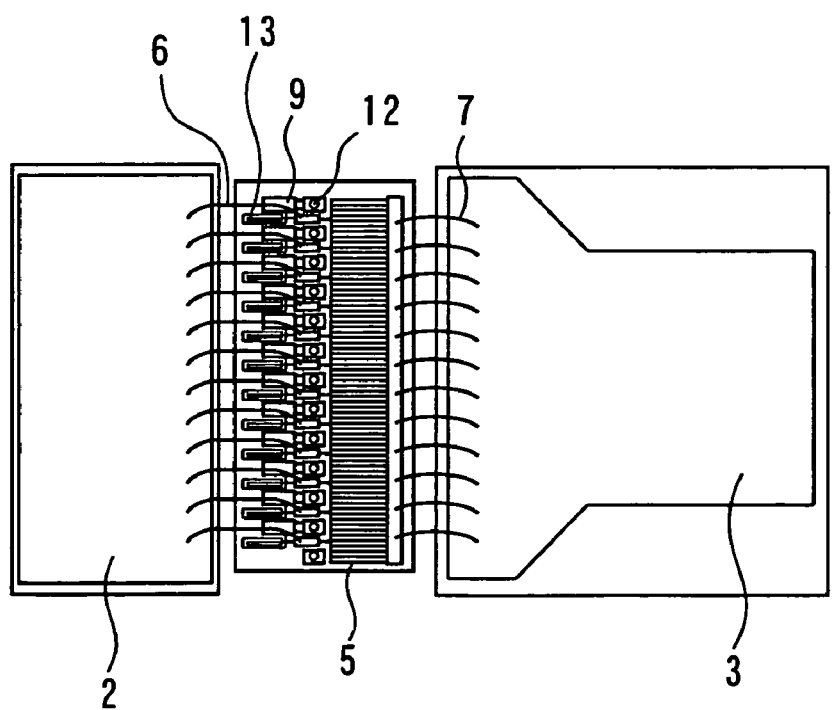
FIG. 7 is a top view of a high frequency power amplifier according to a fifth embodiment of the present invention.

FIG. 7 is a top view of a high frequency power amplifier according to a fifth embodiment of the present invention. According to the present embodiment, each resonant circuit includes an MIM capacitor 9, a throughhole 12, and a spiral inductor 13 that are formed on the same chip as the transistor 5. One end of the MIM capacitor 9 is connected to the gate electrode of a corresponding transistor cell 1 by the spiral inductor 13, and the other end is grounded through the throughhole 12. All other components are similar to those described in connection with the first to fourth embodiments.

Since the MIM capacitors 9 and the spiral inductors 13 are integrated on the same chip (as the transistor 5), the assembly process can be simplified, as in the fourth embodiment. Further, since each resonant circuit includes a spiral inductor 13 instead of a bonding wire, the design accuracy of the resonant frequency can be enhanced, resulting in reduced assembly process variations.

Sixth Embodiment

Figure 8:
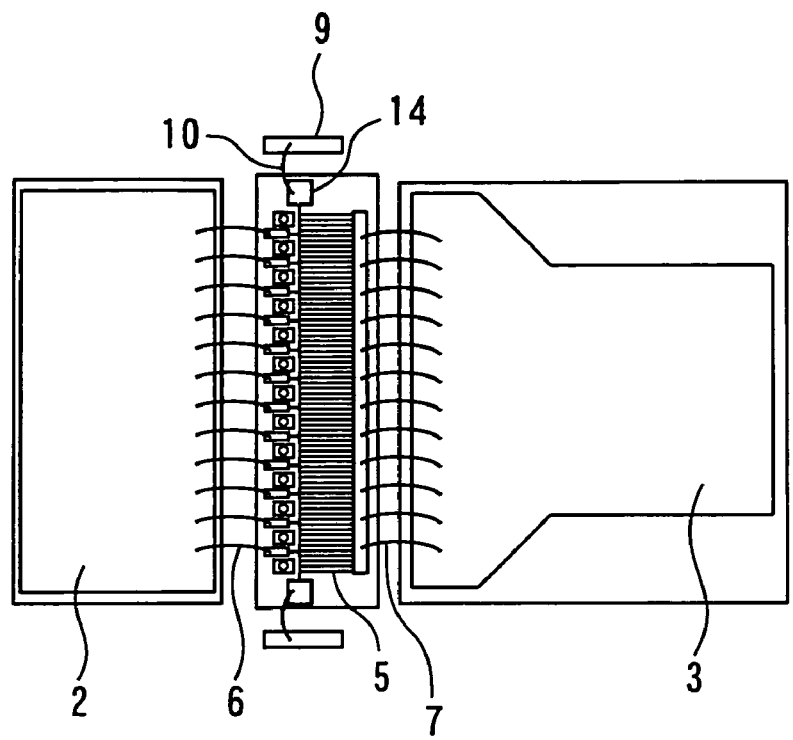
FIG. 8 is a top view of a high frequency power amplifier according to a sixth embodiment of the present invention.

FIG. 8 is a top view of a high frequency power amplifier according to a sixth embodiment of the present invention. According to the present embodiment, each resonant circuit includes an MIM capacitor 9 formed on a different chip than the transistor 5. One end of the MIM capacitor 9 is connected by a bonding wire 10 to a pad 14 extending from the gate electrodes in a direction perpendicular to the gate-to-drain direction. All other components are similar to those described in connection with the first to fifth embodiments.

This arrangement eliminates the need to dispose the resonant circuits on a region adjacent to a side of the transistor 5 perpendicular to the gate-to-drain direction, and thereby increases the degree of freedom of the bonding wires 6 for connecting between the gate electrodes and the input side matching circuit 2 in terms of length, resulting in easy design.

Seventh Embodiment

Figure 9:
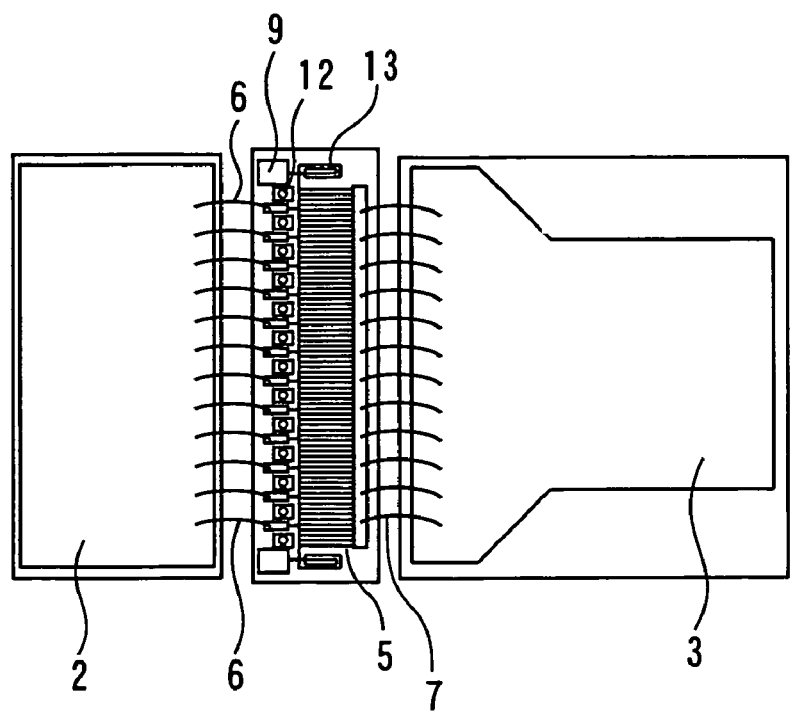
FIG. 9 is a top view of a high frequency power amplifier according to a seventh embodiment of the present invention.

FIG. 9 is a top view of a high frequency power amplifier according to a seventh embodiment of the present invention. According to the present embodiment, each resonant circuit includes an MIM capacitor 9, a throughhole 12, and a spiral inductor 13 that are formed on the same chip as the transistor 5 such that they are disposed on regions adjacent to sides of the transistor 5 parallel to the gate-to-drain direction (that is, the upper and lower sides of the transistor 5 as viewed in the figure). One end of the MIM capacitor 9 is connected to the gate electrode of a corresponding transistor cell through the spiral inductor, and the other end is grounded through the throughhole 12. All other components are similar to those described in connection with the first to sixth embodiments.

Eighth Embodiment

Figure 10:
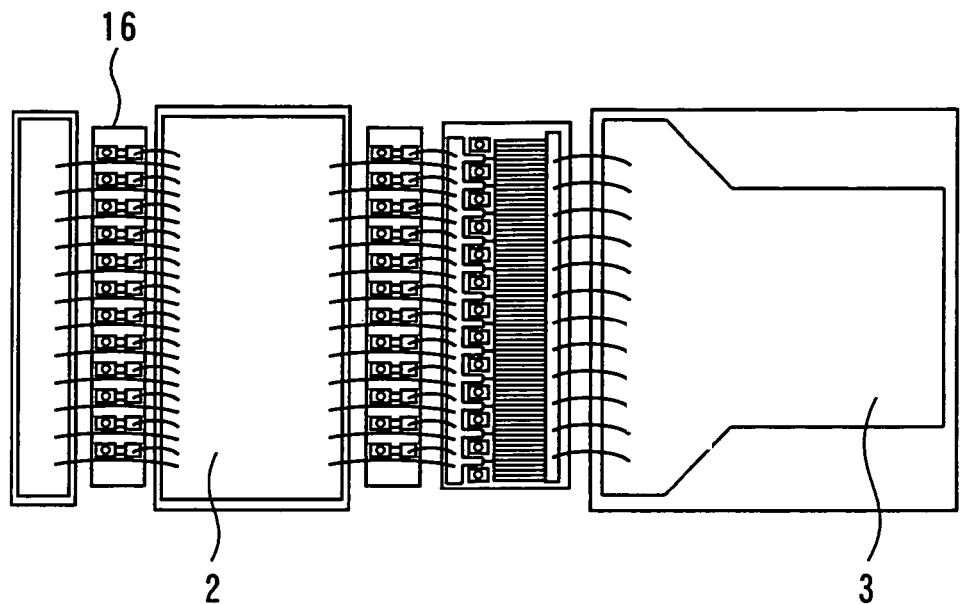
FIG. 10 is a top view of a high frequency power amplifier according to an eighth embodiment of the present invention.
Figure 11:
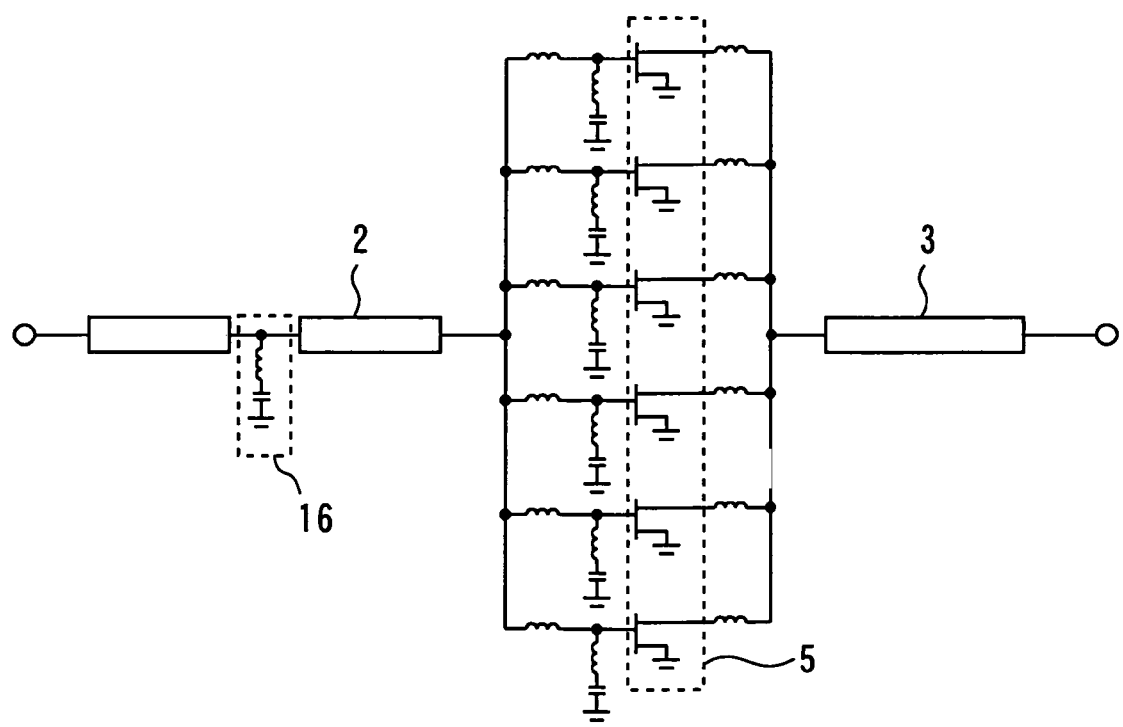
FIG. 11 is a circuit diagram of the high frequency power amplifier of FIG. 10.

FIG. 10 is a top view of a high frequency power amplifier according to an eighth embodiment of the present invention; and FIG. 11 is a circuit diagram of the high frequency power amplifier of FIG. 10. The high frequency power amplifier of the present embodiment is a variation of the high frequency power amplifier of the first embodiment and additionally includes a second resonant circuit 16. The second resonant circuit 16 is spaced from the (primary) resonant circuits a distance corresponding to an electrical length of a quarter wavelength at the operational frequency of the transistor 5.

With this arrangement, when a second harmonic signal is entered from the input side, the second resonant circuit 16 reflects the signal, thereby reducing variations in the load impedance at the second harmonic as seen from the edge of the gate of the transistor (or from the gate electrode side).

It should be noted that although in the first to eighth embodiments each resonant circuit is connected between the gate electrode of a respective transistor cell and the input side matching circuit, the present invention is not limited to this particular arrangement. Each resonant circuit may be connected between the drain electrode of a respective transistor cell and the output side matching circuit.

Ninth Embodiment

According to a ninth embodiment of the present invention, the resonant circuits are set to resonate at a frequency in the range of 92% to 116% of the second harmonic frequency of the operation frequency so as to act as a short circuit or exhibit substantially low impedance (at the second harmonic frequency) as seen from the gate electrode side. All other components are configured in the same way as described in connection with the first to eighth embodiments.

Figure 12:
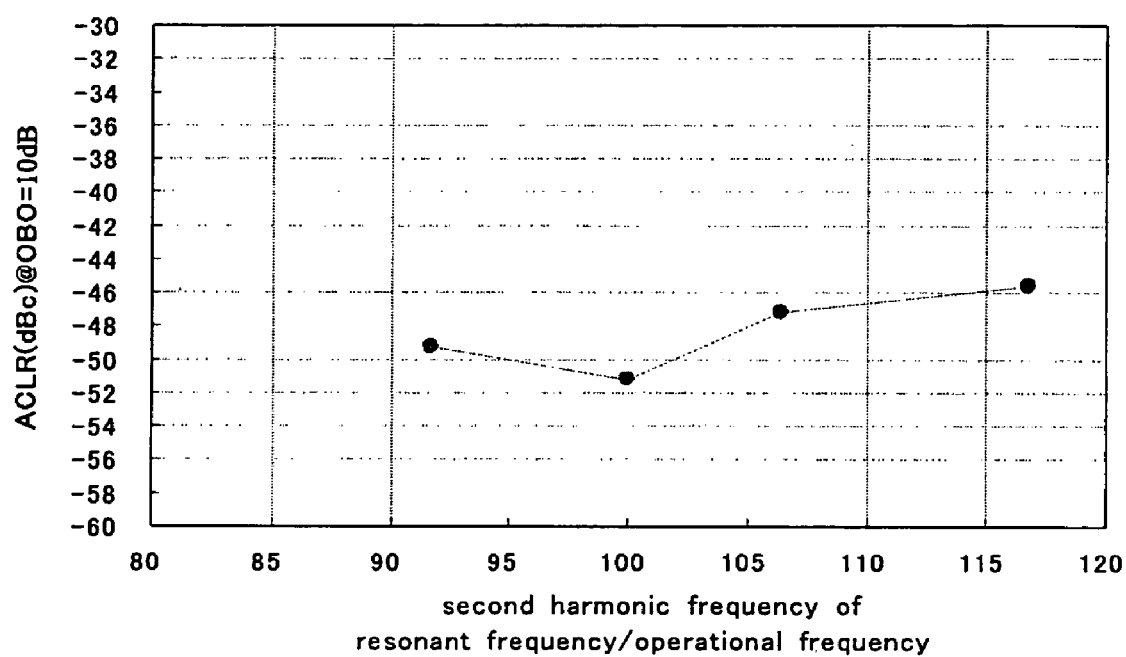
FIG. 12 is a diagram showing the resonant frequency dependence of the ACLR characteristic of these high frequency power amplifiers at a back-off output point of 10 dB from the saturation power point when W-CDMA modulation signals (according to 3GPP) are input to them.
Figure 13:
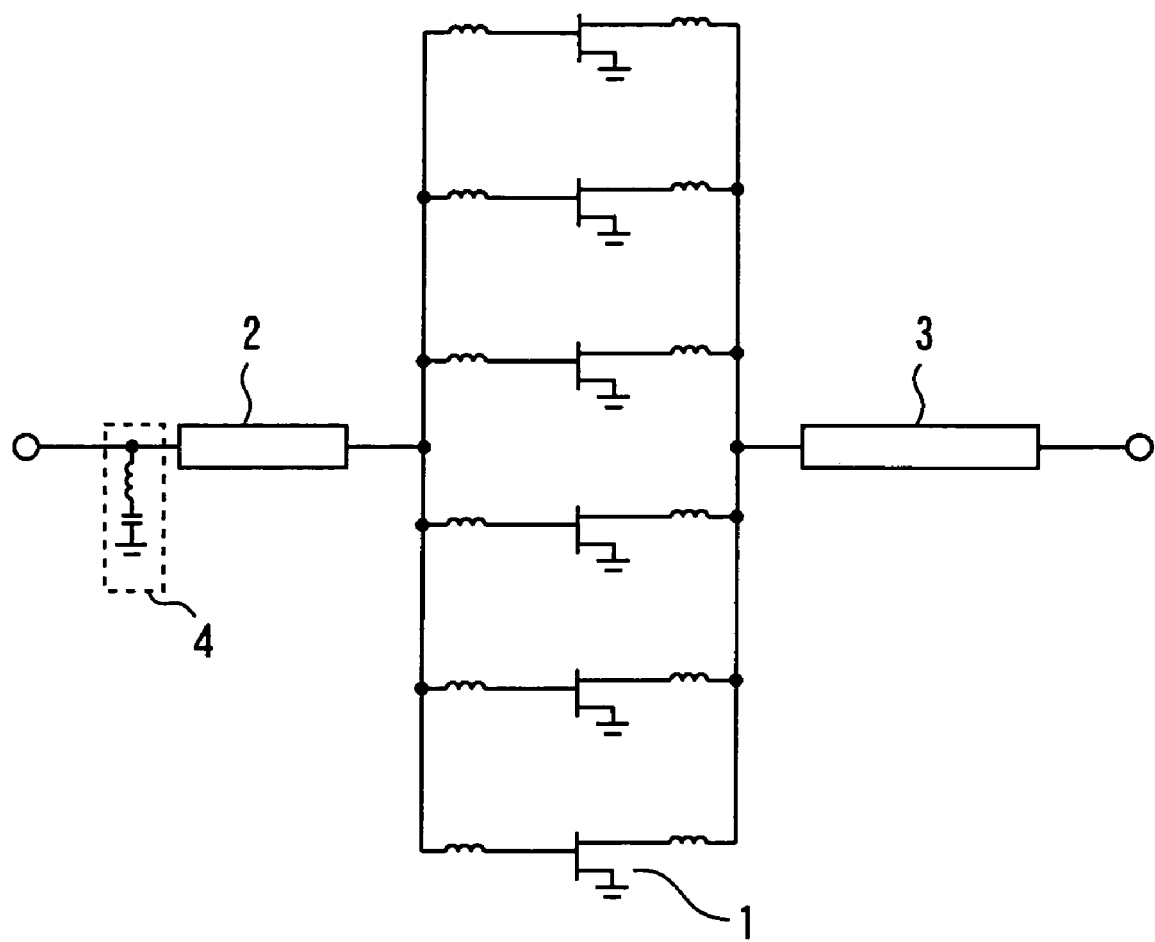
FIG. 13 shows such a conventional high frequency power amplifier.

We experimentally manufactured high frequency power amplifiers according to the first embodiment such that their resonant circuits exhibited different resonant frequencies. FIG. 12 is a diagram showing the resonant frequency dependence of the ACLR characteristic of these high frequency power amplifiers at a back-off output point of 10 dB from the saturation power point when W-CDMA modulation signals (according to 3GPP) are input to them. This figure indicates that use of a resonant circuit having a resonant frequency in the range of 92% to 116% of the second harmonic frequency of the operational frequency leads to very good distortion characteristics (an ACLR of −45 dBc or less).

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2005-220933, filed on Jul. 29, 2005 and a Japanese Patent Application No. 2005-367964, filed on Dec. 21, 2005 including specification, claims, drawings and summary, on which the Convention priority of the present application is based, are incorporated herein by reference in its entirety.

What is claimed is:

1. A high frequency power amplifier comprising:
   a multi-finger transistor including a plurality of transistor cells electrically connected in parallel;
   an input side matching circuit connected to gate electrodes of the plurality of transistor cells; and
   resonant circuits, each resonant circuit being connected between a gate electrode of a respective one of the plurality of transistor cells and the input side matching circuit, wherein the resonant circuits resonate at a second harmonic frequency of operational frequency of the transistor or at a frequency within a predetermined range centered at the second harmonic frequency and act as a short circuit or exhibit low impedance as seen from the gate electrode.

2. The high frequency power amplifier as claimed in claim 1, wherein the predetermined range centered at the second harmonic frequency ranges from 92% to 116% of the second harmonic frequency.

3. The high frequency power amplifier as claimed in claim 1, wherein:
   each resonant circuit includes a capacitance on a different chip from the transistor; and
   a first end of each capacitance is connected to a gate electrode of a corresponding one of the plurality of transistor cells by a bonding wire.

4. The frequency power amplifier as claimed in claim 2, wherein:
   each resonant circuit includes a capacitance on a different chip from the transistor; and
   a first end of each capacitance is connected to a gate electrode of a corresponding one of the plurality of transistor cells by a bonding wire.

5. The high frequency power amplifier as claimed in claim 3, wherein a second end of each capacitance is connected to a throughhole by a bonding wire and grounded through the throughhole, the throughhole being in a chip including the transistor.

6. The high frequency power amplifier as claimed in claim 4, wherein a second end of each capacitance is connected to a throughhole by a bonding wire and grounded through the throughhole, the throughhole being in a chip including the transistor.

7. The high frequency power amplifier as claimed in claim 3, wherein a second end of each capacitance is grounded through a throughhole in a chip including the capacitance.

8. The high frequency power amplifier as claimed in claim 4, wherein a second end of each capacitance is grounded through a throughhole in a chip including the capacitance.

9. The high frequency power amplifier as claimed in claim 1, wherein:
   each resonant circuit includes an MIM capacitor on a chip including the transistor;
   a first end of each MIM capacitor is connected to a gate electrode of a corresponding one of the plurality of transistor cells by a bonding wire; and
   a second end of the MIM capacitor is grounded through a throughhole in the chip including the transistor.

10. The high frequency power amplifier as claimed in claim 2, wherein:
    each resonant circuit includes an MIM capacitor formed on a chip including the transistor;
    a first end of each MIM capacitor is connected to a gate electrode of a corresponding one of the plurality of transistor cells by a bonding wire; and
    a second end of each MIM capacitor is grounded through a throughhole formed in the chip including the transistor.

11. The high frequency power amplifier as claimed in claim 1, wherein:
    each resonant circuit includes an MIM capacitor, a throughhole, and a spiral inductor on a chip including the transistor;

a first end of each MIM capacitor is connected to a gate electrode of a corresponding one of the plurality of transistor cells through a corresponding spiral inductor; and a second end of each MIM capacitor is grounded through the throughhole.

12. The high frequency power amplifier as claimed in claim 2, wherein:

each resonant circuit includes an MIM capacitor, a throughhole, and a spiral inductor that are on a chip including the transistor;

a first end of the MIM capacitor is connected to a gate electrode of a corresponding one of the plurality of transistor cells through a corresponding spiral inductor; and a second end of each MIM capacitor is grounded through the throughhole.

13. The high frequency power amplifier as claimed in claim 1, wherein:

each resonant circuit includes an MIM capacitor on a different chip from the transistor; and a first end of each MIM capacitor is connected to a pad by a bonding wire, the pads extending from the gate electrodes of the plurality of transistor cells in a direction perpendicular to a gate-to-drain direction.

14. The high frequency power amplifier as claimed in claim 2, wherein:

each resonant circuit includes an MIM capacitor on a different chip from the transistor; and a first end of each MIM capacitor is connected to a pad by a bonding wire, the pads extending from the gate electrodes of the plurality of transistor cells in a direction perpendicular to a gate-to-drain direction.

15. The high frequency power amplifier as claimed in claim 1, wherein:

each resonant circuit includes an MIM capacitor, a throughhole, and a spiral inductor that are on a chip including the transistor and disposed on regions adjacent to sides of the transistor, parallel to a gate-to-drain direction;

a first end of each MIM capacitor is connected to a gate electrode of a corresponding one of the plurality of transistor cells through a corresponding spiral inductor; and a second end of each MIM capacitor is grounded through the throughhole.

16. The high frequency power amplifier as claimed in claim 2, wherein:

each resonant circuit includes an MIM capacitor, a throughhole, and a spiral inductor that are on a chip including the transistor and disposed on regions adjacent to sides of the transistor, parallel to a gate-to-drain direction;

a first end of each MIM capacitor is connected to a gate electrode of a corresponding one of the plurality of transistor cells through a corresponding spiral inductor; and a second end of each MIM capacitor is grounded through the throughhole.

17. The high frequency power amplifier as claimed in claim 1, further comprising a second resonant circuit spaced from the resonant circuits by a distance corresponding to an electrical length of a quarter wavelength at the operational frequency of the transistor.

18. The high frequency power amplifier as claimed in claim 2, further comprising a second resonant circuit spaced from the resonant circuits by a distance corresponding to an electrical length of a quarter wavelength at the operational frequency of the transistor.

19. A high frequency power amplifier comprising:

a multi-finger transistor including a plurality of transistor cells electrically connected in parallel;

an output side matching circuit connected to drain electrodes of the plurality of transistor cells; and resonant circuits, each resonant circuit being connected between a drain electrode of a respective one of the plurality of transistor cells and the output side matching circuit, wherein the resonant circuits resonate at a second harmonic frequency of operational frequency of the transistor or at a frequency within a predetermined range centered at the second harmonic frequency and act as a short circuit or exhibit low impedance as seen from the gate electrode.

* * * * *